(12) United States Patent
Wen et al.

(10) Patent No.: US 8,692,284 B2
(45) Date of Patent: Apr. 8, 2014

(54) INTERPOSER AND MANUFACTURING METHOD THEREOF

(76) Inventors: Ying-Nan Wen, Hsinchu (TW); Chien-Hung Liu, New Taipei (TW); Wei-Chung Yang, Pingzhen (TW)

( * ) Notice: Subject to any disclaimer, the term of this patent is extended or adjusted under 35 U.S.C. 154(b) by 0 days.

(21) Appl. No.: 13/484,140

(22) Filed: May 30, 2012

(65) Prior Publication Data

US 2012/0305977 A1    Dec. 6, 2012

(30) Foreign Application Priority Data

May 31, 2011   (CN) .......................... 2011 1 0145328

(51) Int. Cl.
*H01L 29/72* (2006.01)
(52) U.S. Cl.
USPC    257/99; 257/741; 257/E21.159; 257/E23.01; 257/E33.066; 438/669

(58) Field of Classification Search
USPC ..................... 257/99, 741, E21.159, E23.01, 257/E33.066; 438/669
See application file for complete search history.

(56) References Cited

U.S. PATENT DOCUMENTS

2012/0261805 A1\* 10/2012 Sundaram et al. ............ 257/666

\* cited by examiner

*Primary Examiner* — Edward Wojciechowicz
(74) *Attorney, Agent, or Firm* — Liu & Liu

(57) ABSTRACT

An embodiment of the present invention provides a manufacturing method of an interposer including: providing a semiconductor substrate having a first surface, a second surface and at least a through hole connecting the first surface to the second surface; electrocoating a polymer layer on the first surface, the second surface and an inner wall of the through hole; and forming a wiring layer on the electrocoating polymer layer, wherein the wiring layer extends from the first surface to the second surface via the inner wall of the through hole. Another embodiment of the present invention provides an interposer.

19 Claims, 11 Drawing Sheets

INTERPOSER AND MANUFACTURING METHOD THEREOF

CROSS REFERENCE TO RELATED APPLICATIONS

This application claims priority of China Patent Application No. 201110145328.9, filed on May 31, 2011, the entirety of which is incorporated by reference herein.

BACKGROUND OF THE INVENTION

1. Field of the Invention

The present invention relates to a circuit board, and in particular relates to an interposer and a manufacturing method thereof.

2. Description of the Related Art

An interposer may be used to connect electronic elements, such as a printed circuit board or a chip, disposed on opposite surfaces of the interposer. The interposer may provide conductive paths to transmit signals between the electronic elements.

Conventional interposer processes generally involve forming an insulating layer, such as a silicon dioxide layer, by thermal oxidation of the interposer substrate. However, the cost of the thermal oxidation process is high, such that the manufacturing cost of the conventional interposer is high. Furthermore, because the substrate surface (i.e. $SiO_2$) of the conventional interposer is difficult to be electroless plated, a seed layer can be formed on the substrate surface only by sputtering. However, the cost of the sputtering process is also high. Therefore, a manufacturing process of an interposer with low manufacturing cost is required.

BRIEF SUMMARY OF THE INVENTION

An embodiment of the invention provides a manufacturing method of an interposer, which includes: providing a semiconductor substrate having a first surface, a second surface, and at least a through hole connecting the first surface to the second surface; electroplating an E-coat polymer layer on the first surface, the second surface, and an inner wall of the through hole; and forming a circuit layer on the E-coat polymer layer, wherein the circuit layer extends from the first surface to the second surface via the inner wall of the through hole.

An embodiment of the invention provides an interposer, which includes a semiconductor substrate having a first surface, a second surface, and at least a through hole connecting the first surface to the second surface; an E-coat polymer layer disposed on the first surface, the second surface, and an inner wall of the through hole; and a circuit layer disposed on the E-coat polymer layer, and extending from the first surface to the second surface via the inner wall of the through hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

An interposer of an embodiment of the present invention may be used to carry electronic chips, for example. For example, the interposer of the embodiments of the invention may be applied to active or passive devices, or electronic components with digital or analog circuits, such as opto electronic devices, micro electro mechanical systems (MEMS), and micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, and/or power modules.

The wafer scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer scale packaging process. In addition, the above mentioned wafer scale packaging process may also be adapted to form chip packages of multi-layer integrated circuit devices by stacking a plurality of wafers having integrated circuits. The supporting wafer mentioned above may be an interposer of an embodiment of the present invention, for example.

FIG. 1A to FIG. 1J are cross-sectional views illustrating a manufacturing process of an interposer according to an embodiment of the present invention.

Figure 1A:
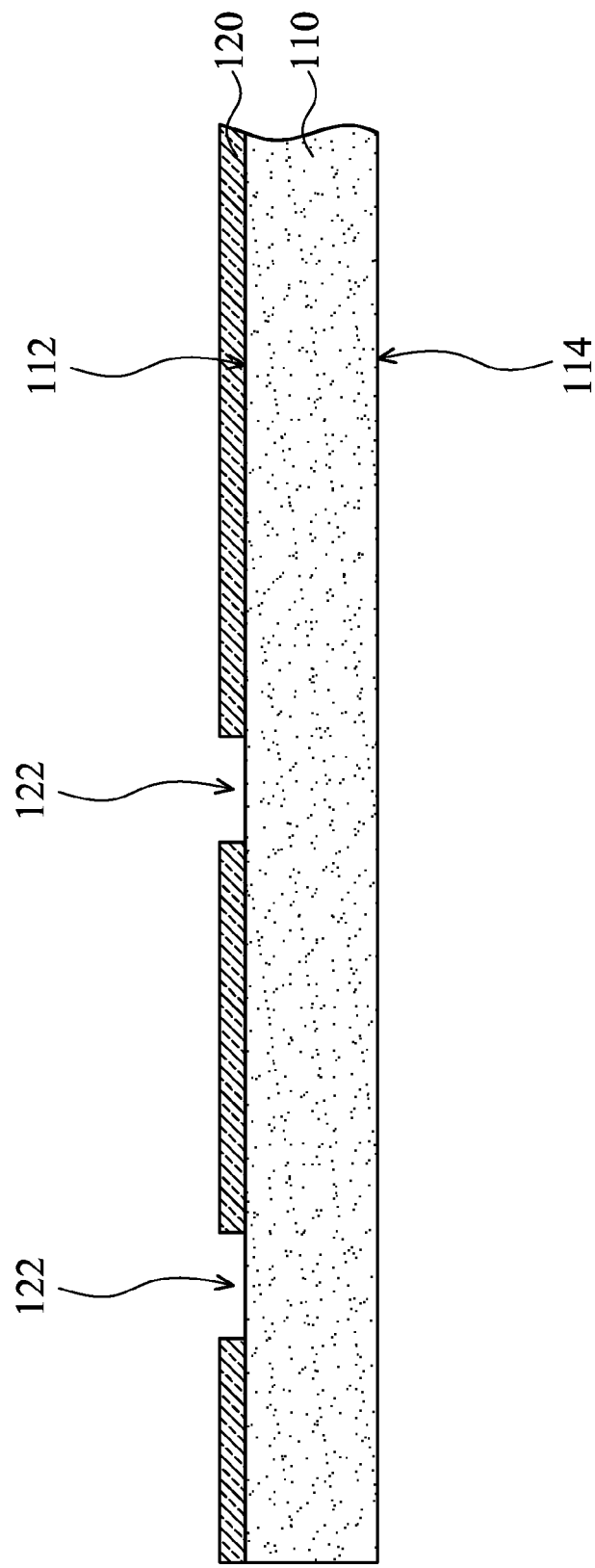
FIG. 1A to FIG. 1J are cross-sectional views illustrating a manufacturing process of an interposer according to an embodiment of the present invention.

Firstly, referring FIG. 1A, a semiconductor substrate 110 is provided, wherein the material of the semiconductor substrate 110 is, for example, silicon, germanium, silicon germanium, silicon carbide, gallium arsenide, or the like. The semiconductor substrate 110 has a surface 112 and a surface 114 opposite thereto. Then, a patterned mask layer 120 (e.g. a photo-resist layer) is formed on the surface 112, and has a plurality of openings 122 to expose a portion of the surface 112.

Figure 1B:
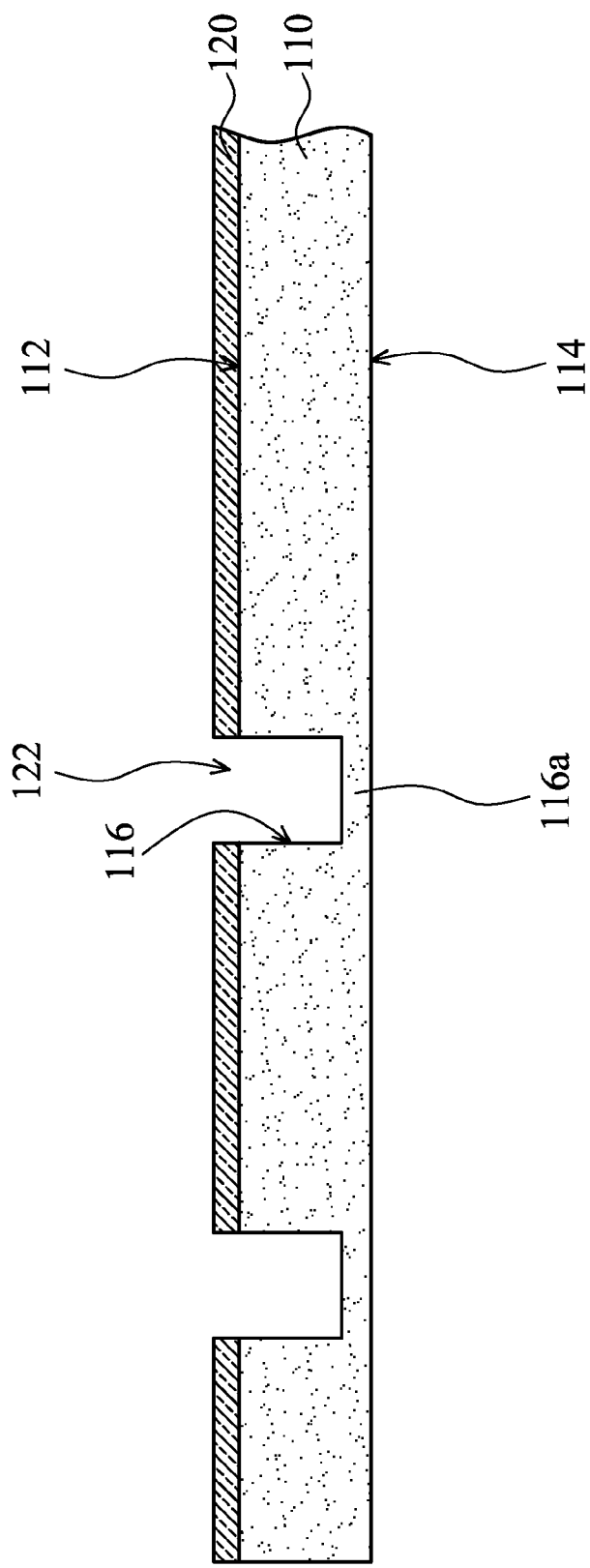

Then, referring to FIG. 1B, the semiconductor substrate 110 is etched using the patterned mask layer 120 as a mask, so as to form a plurality of recesses 116 below the openings 122, wherein the recess 116 has a bottom 116a. The method of etching the semiconductor substrate 110 is dry etching or wet etching, for example.

Figure 1C:
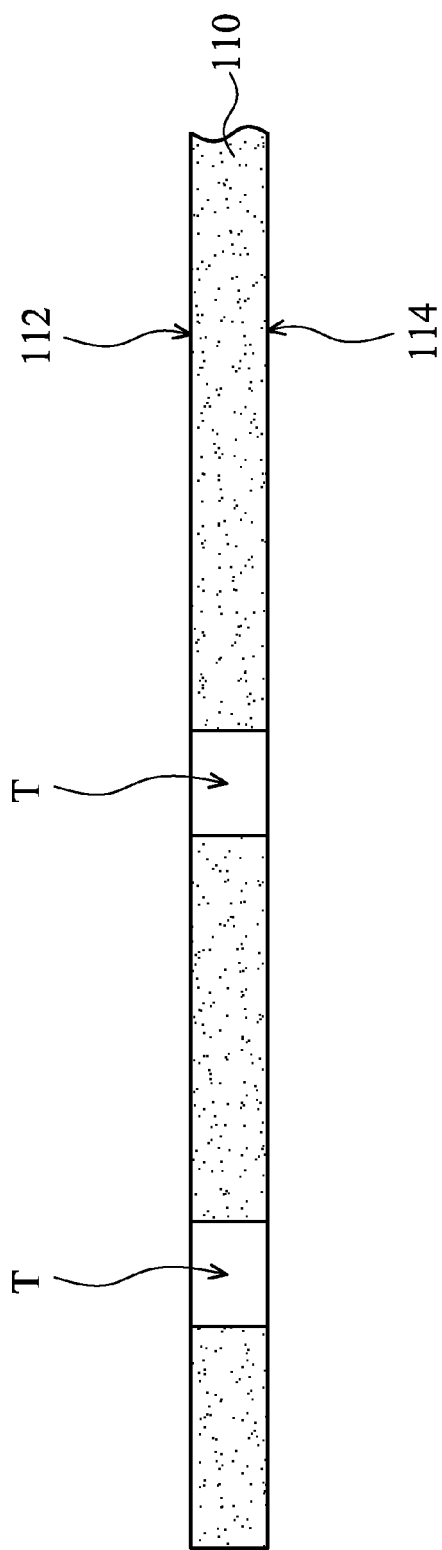

Then, referring to FIG. 1C, the patterned mask layer 120 is removed, and the bottoms 116a of the recesses 116 are removed by grinding the semiconductor substrate 110 from the surface 114 to form through holes T connecting the surfaces 112 and 114. Although, the method of forming the through holes T of the embodiment firstly forms the recesses 116 and then removes the bottoms 116a of the recesses 116, the manufacturing method of the through holes T is not limited thereto. In other embodiments, the through holes may be formed by etching through the semiconductor substrate 110. Then, an optional planarization process may be performed on the surface 114 by, for example, wet etching.

In one embodiment, the method of thinning the semiconductor substrate 110 to remove the bottoms 116a of the recesses 116 may also include etching or milling. In one embodiment, the manufacturing method of the through holes T is drilling either mechanically or by laser, ultrasonic milling, sand blasting, waterjet, or by using other mechanical/laser drills, or combinations thereof.

Figure 1D:
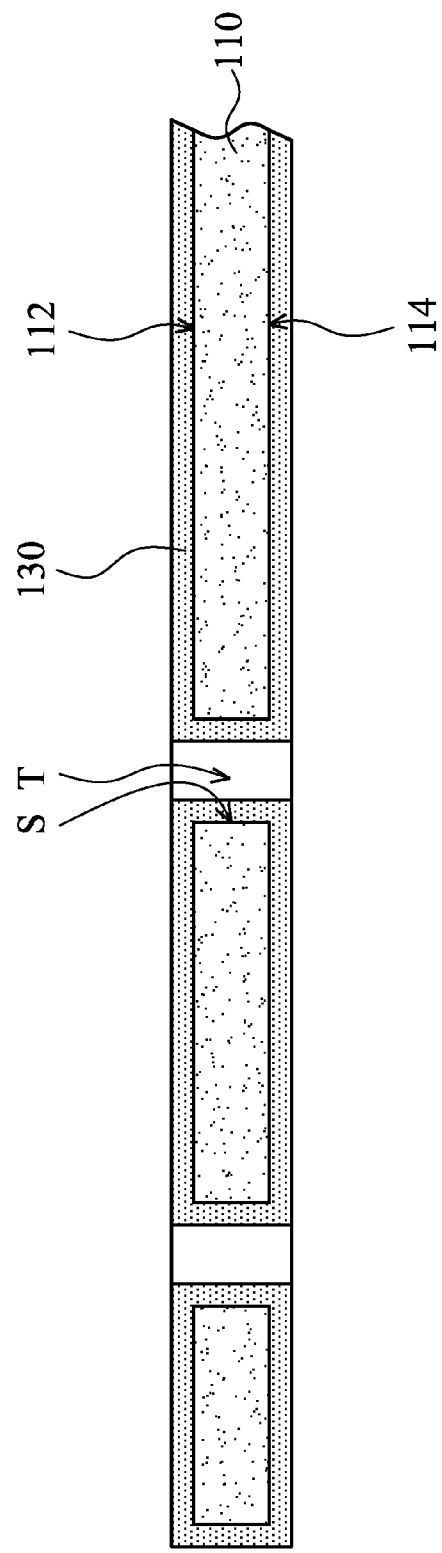

Then, referring to FIG. 1D, an electroplating process is performed to electroplate an E-coat polymer layer 130 on the surfaces 112 and 114 and inner walls S of the through holes T. In one embodiment, the E-coat polymer layer 130 completely covers the surfaces 112 and 114 and the inner walls S of the through holes T.

Specifically, in the present embodiment, the manufacturing method of the E-coat polymer layer 130 mentioned above includes dissolving a polymer material (not shown) in an electrolyte and disposing the semiconductor substrate 110 on one of two electrodes in the electrolyte; and then, applying a voltage difference between the two electrodes. As such, the polymer material is deposited on the semiconductor substrate 110 to form the E-coat polymer layer 130. The manufacturing method of the E-coat polymer layer 130 are disclosed in detail in U.S. Pat. Nos. 4,487,674, 4,943,447, 7,479,246 and TAIWAN Patent No. 524812, wherein the disclosures of which are incorporated herein by reference. The material of the E-coat polymer layer 130 includes epoxy resins, polyesters, acrylics, vinyl polymers, polyamides, polyurethanes, alkyds, polycarboxylics, or combinations thereof, or other resins suitable for electroplating.

It should be noted that, compared to the conventional method of forming the insulating layer of the interposer by thermal oxidation, the E-coat polymer layer 130 of the present embodiment is formed by electroplating, such that the present embodiment may lower the manufacturing cost effectively.

Figure 1E:
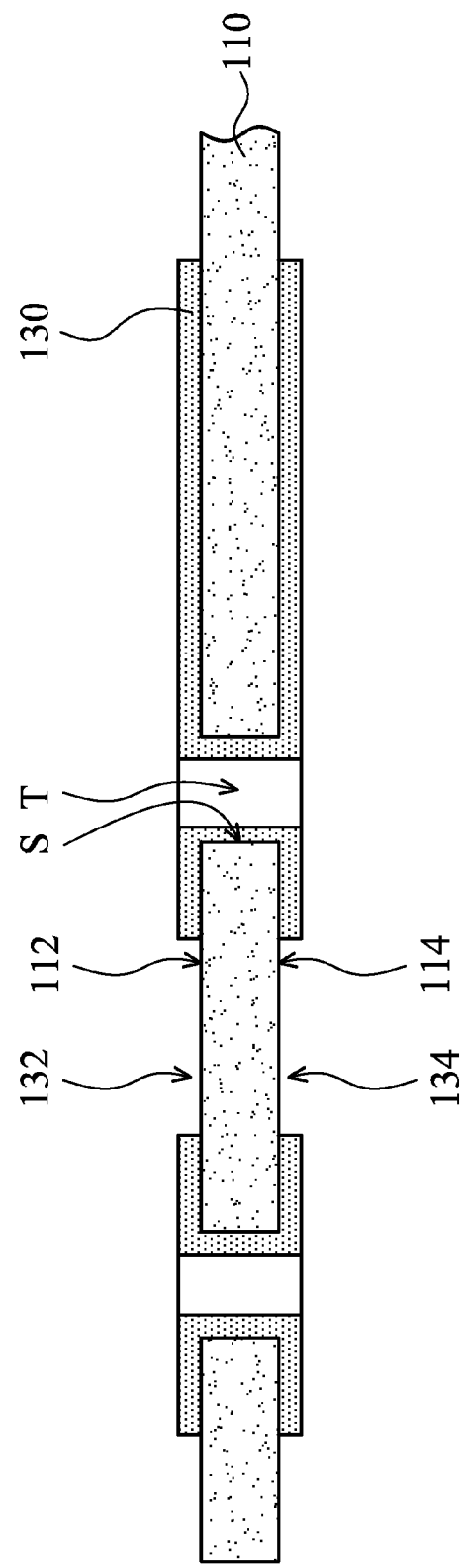

Then, referring to FIG. 1E, the E-coat polymer layer 130 is patterned so as to form a plurality of openings 132 and 134 on the E-coat polymer layer 130, wherein the openings 132 and 134 expose a portion of the surface 112 and a portion of the surface 114 respectively. The pattern of the patterned polymer layer 130 is substantially corresponding to circuit layers which are subsequently formed. In one embodiment, the material of the E-coat polymer layer 130 may be a photosensitive polymer material, and the method of patterning the E-coat polymer layer 130 may comprise exposure and development.

Furthermore, in one embodiment, a surface roughening treatment is performed to the E-coat polymer layer 130 so as to help the circuit layers to quickly be formed on the E-coat polymer layer 130 during subsequent processes. The surface roughening treatment may use an acid etching solution or a basic etching solution, wherein the acid etching solution is, for example, a hydrochloric acid solution, a nitric acid solution, a sulfuric acid solution, or a combination solution of sulfuric acid and chromic acid, and the basic etching solution is, for example, a potassium hydroxide solution, or a sodium hydroxide solution.

Figure 1F:
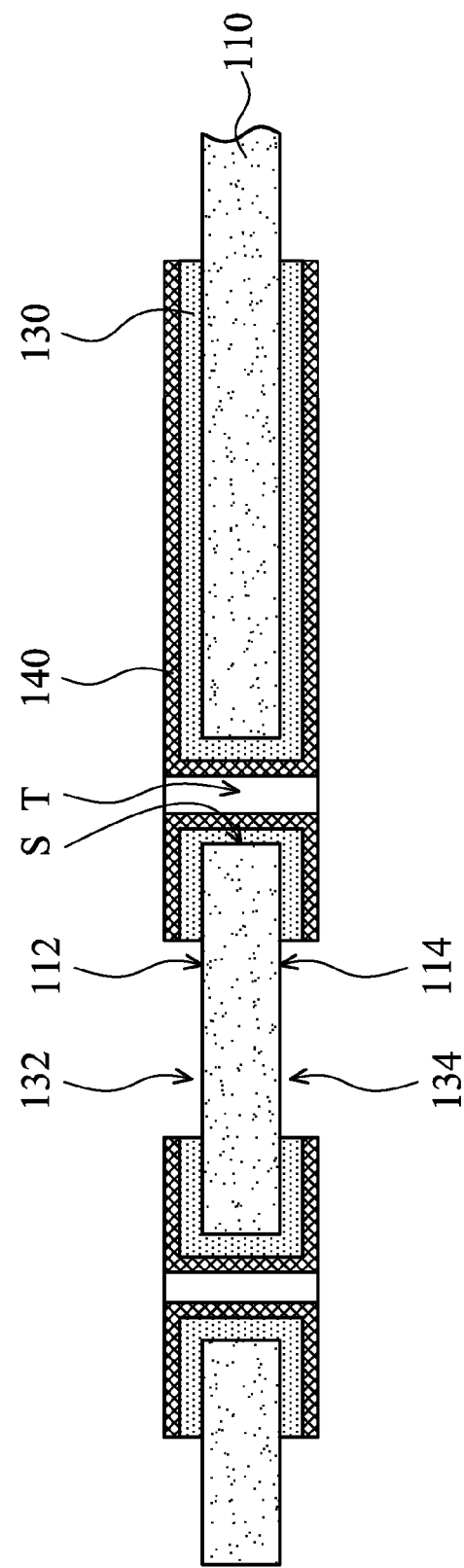

Then, referring to FIG. 1F, an electroless plating process is performed to form an electroless plating metal seed layer 140 on the E-coat polymer layer 130. In one embodiment, the material of the electroless plating metal seed layer 140 is, for example, pure copper, or other suitable seed materials.

It should be noted that, because the surface property of the E-coat polymer layer 130 is suitable to form the electroless plating metal seed layer 140, and the surface property of the semiconductor substrate 110 is not suitable to form the electroless plating metal seed layer 140, then therefore the electroless plating metal seed layer 140 selectively forms on the E-coat polymer layer 130. In one embodiment, the film pattern of the electroless plating metal seed layer 140 is substantially the same as the film pattern of the E-coat polymer layer 130, so the electroless plating metal seed layer 140 also exposes the portion of the surface 112 and the portion of the surface 114.

It should be noted that, compared to the conventional manufacturing method of the interposer that forms the seed layer on the insulating layer (silicon dioxide layer) only by sputtering, the surface property of the E-coat polymer layer 130 of the present embodiment is suitable for an electroless plating process. Therefore, the seed layer of the present embodiment may be formed by the electroless plating process with lower manufacturing cost, which may effectively reduce the manufacturing cost of the interposer.

Figure 1G:
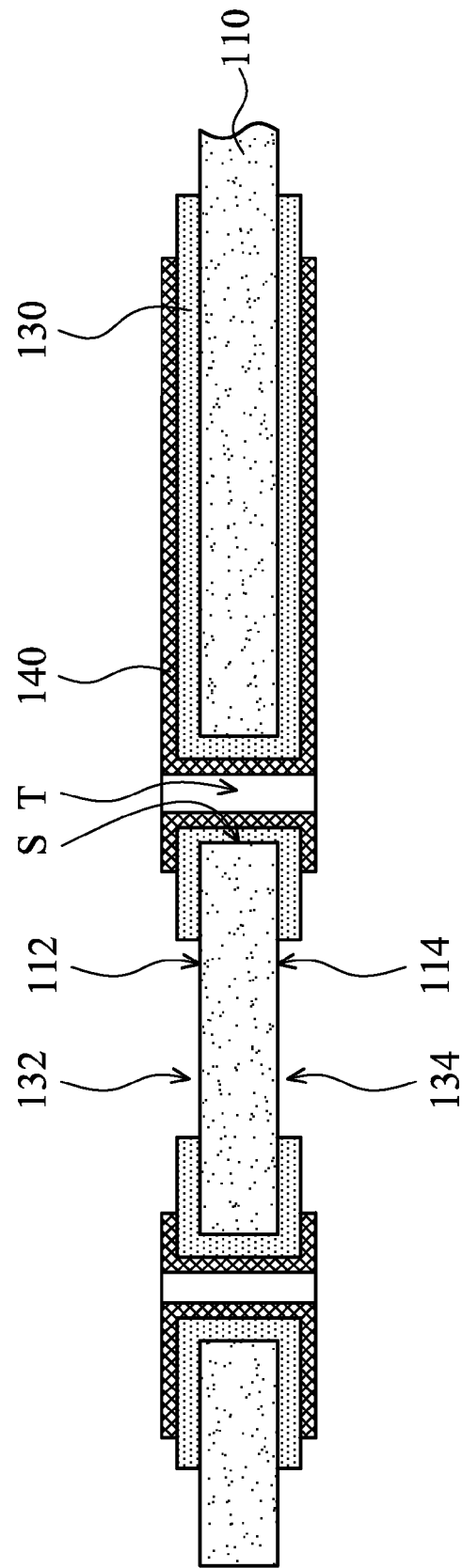

Then, referring to FIG. 1G, the electroless plating metal seed layer 140 is patterned, such that the pattern thereof draws back from the openings 132 and 134, which avoids the shortage between the electrical devices disposed in the openings 132 and 134 during the subsequent processes and the electroless plating metal seed layer 140. At this time, the electroless plating metal seed layer 140 exposes a portion of the E-coat polymer layer 130. In one embodiment, the method of patterning the electroless plating metal seed layer 140 includes: forming a patterned mask layer (not shown) on the electroless plating metal seed layer 140, wherein the patterned mask layer exposes a portion of the electroless plating metal seed layer 140 on the surfaces 112 and 114; and then removing the exposed portion of the electroless plating metal seed layer 140 by using the patterned mask layer as a mask; and then removing the patterned mask layer. In one embodiment, the position of the portion of the electroless plating metal seed layer 140 exposed by the patterned mask layer is neighboring the openings 132 and 134 of the E-coat polymer layer 130.

Figure 1H:
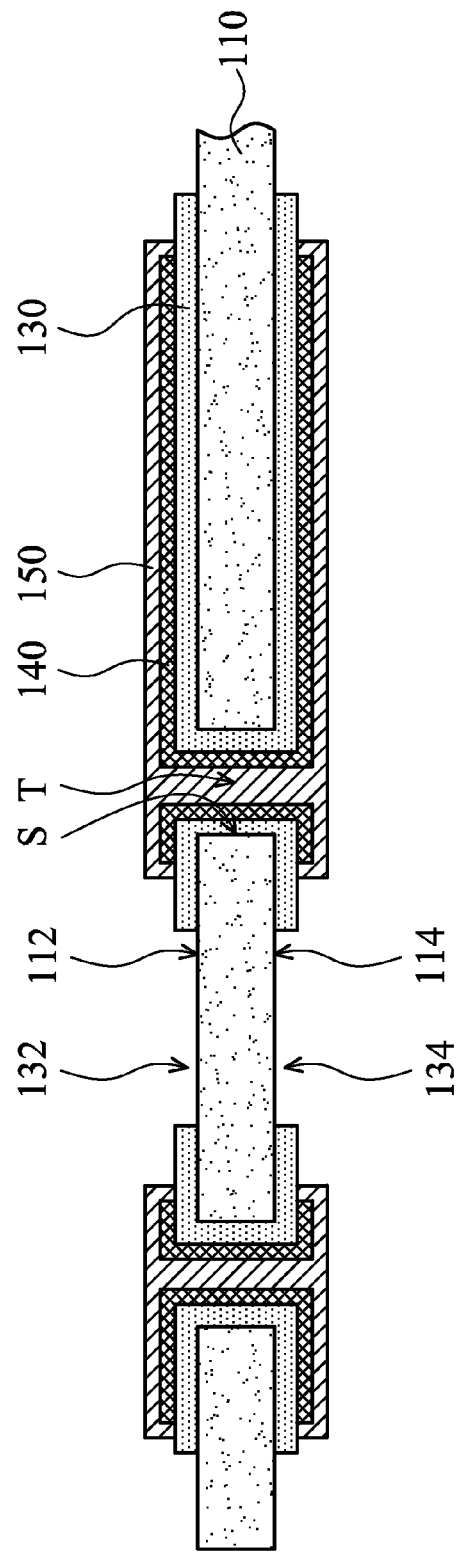

Then, referring to FIG. 1H, a conductive layer 150 is electroplated on the electroless plating metal seed layer 140, and the conductive layer 150 fills the through holes T. The material of the conductive layer 150 is, for example, copper, aluminum, tungsten, nickel, or combinations thereof. In one embodiment, the material of the conductive layer 150 is the same as the material of the electroless plating metal seed layer 140. In another embodiment, the material of the conductive layer 150 is different from the material of the electroless plating metal seed layer 140.

Figure 1I:
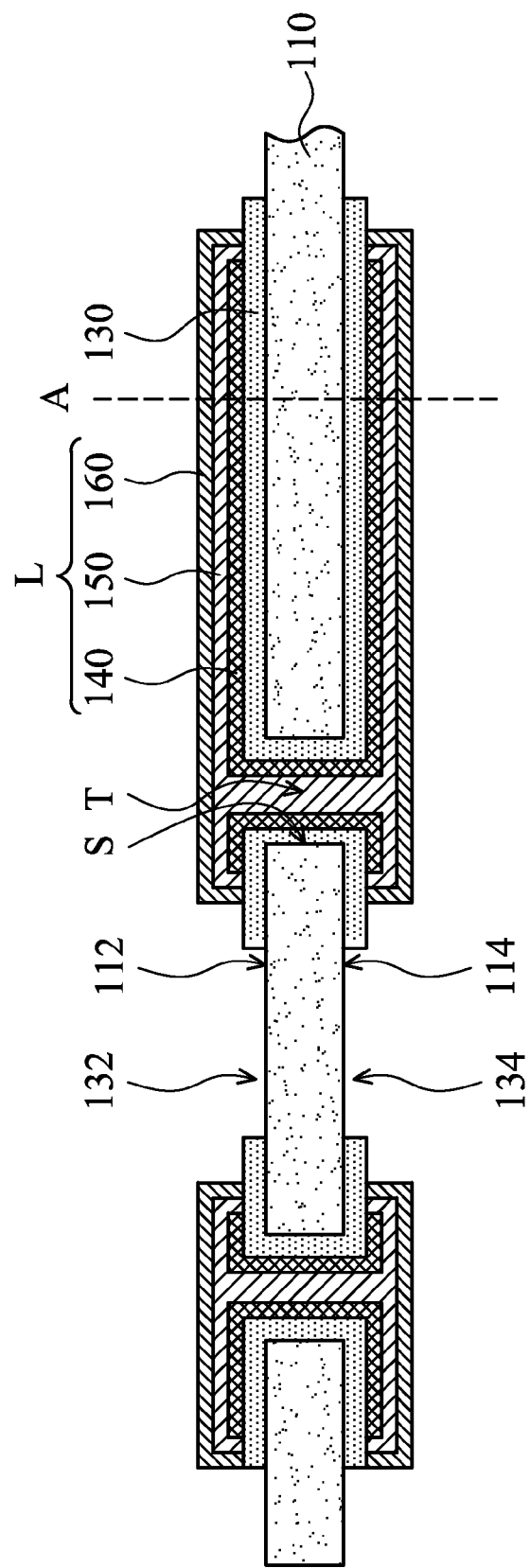

Then, referring to FIG. 1I, a conductive layer 160 may be electroplated on the conductive layer 150, and the material of the conductive layer 160 is, for example, nickel/gold, or nickel/silver. In one embodiment, the electroless plating metal seed layer 140 and the conductive layers 150 and 160 may compose a circuit layer L, wherein the circuit layer L extends from the surface 112 to the surface 114 via the inner walls S of the through holes T. In another embodiment, the electroless plating metal seed layer 140 and the conductive layer 150 also may constitute a circuit layer.

Figure 1J:
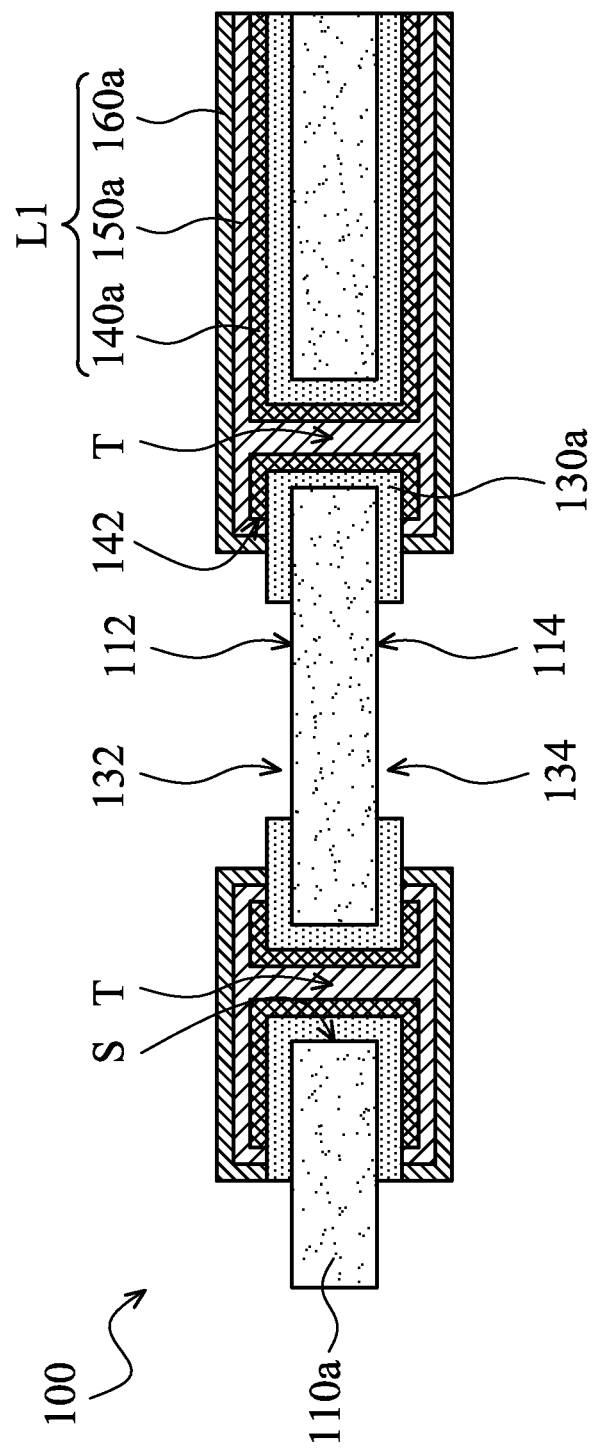

Referring to FIGS. 1I and 1J, in the present embodiment, a dicing process may be optionally performed to the semiconductor substrate 110 to form at least one interposer 100. Specifically, the dicing process is, for example, sawing the semiconductor substrate 110 along the scribe line A. Although FIG. 1J shows only one interposer 100, the number of the interposer 100 is not so limited. That is to say, a plurality of interposers 100 may be formed after the dicing process.

Figure 2:
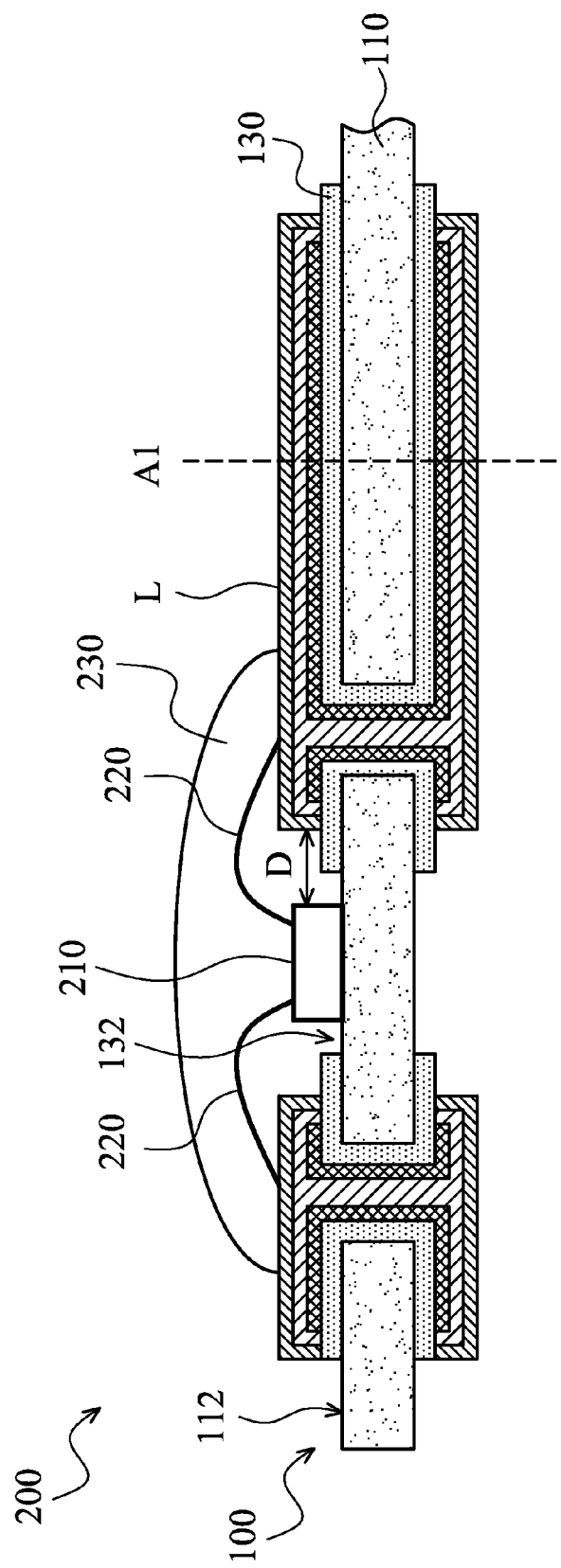
FIG. 2 is a cross-sectional view illustrating a manufacturing process of a chip package according to an embodiment of the present invention.

FIG. 2 is a cross-sectional view illustrating a manufacturing process of a chip package according to an embodiment of the present invention. Referring to FIG. 2, before the dicing process is performed to the semiconductor substrate 110 mentioned above, at least one chip 210 may be provided, and a chip bonding process may be performed so as to bond the chip 210 onto the semiconductor substrate 110 of FIG. 1I, wherein the chip 210 is, for example, a light emitting diode chip or other suitable chips.

Specifically, the chip 210 may be disposed on the surface 112 exposed by the opening 132 of the E-coat polymer layer 130, and may be separated from the E-coat polymer layer 130. In one embodiment, the chip 210 may be adhered to the semiconductor substrate 110 through an adhesive layer (not shown).

Then, a wire bonding process may be performed so as to form a plurality of wires 220 connecting between the chip 210 and the circuit layer L, wherein the material of the wires 220 includes gold or other materials with good conductive properties.

Then, a package encapsulant 230 may be formed on the semiconductor substrate 110 to encapsulate the chip 210 and the wires 220, which shields the chip 210 and the wires 220 from environmental moisture and contamination so as to avoid affecting the conductive properties of the chip 210 and the wires 220.

Then, the semiconductor substrate 110 may be sawed along the scribe line A1 to form at least one chip package 200. Although FIG. 2 shows only one chip package 200, the number of the chip package 200 is not limited thereto. That is to say, a plurality of chip packages 200 may be formed after the dicing process. In one embodiment, the chip package 200 is a light emitting diode package.

Although, in the embodiment mentioned above, the chip bonding process, etc, are performed before the dicing process, in other embodiments, the chip bonding process, etc, may be performed after the dicing process.

Referring to FIG. 1J again, the interposer 100 of the present embodiment includes a semiconductor substrate 110a, an E-coat polymer layer 130a, and a circuit layer L1, wherein the semiconductor substrate 110a has two opposite surfaces 112 and 114 and a plurality of through holes T connecting the surfaces 112 and 114.

The E-coat polymer layer 130a is disposed on the surfaces 112 and 114 and inner walls S of the through holes T. In the present embodiment, the E-coat polymer layer 130a has a plurality of openings 132 and 134, wherein the openings 132 and 134 expose a portion of the surface 112 and a portion of the surface 114 respectively.

The circuit layer L1 is disposed on the E-coat polymer layer 130a, and extends from the surface 112 to the surface 114 via the inner walls S of the through holes T. In one embodiment, the circuit layer L1 includes an electroless plating metal seed layer 140a and conductive layers 150a and 160a, wherein the electroless plating metal seed layer 140a is disposed on the E-coat polymer layer 130a, and the conductive layers 150a and 160a are sequentially disposed on the electroless plating metal seed layer 140a.

In one embodiment, the circuit layer L1 exposes the E-coat polymer layer 130a adjacent to the opening 132 to increase a distance between the electric devices (e.g. chips) and the circuit layer L1, which avoids the shortage between the electric devices and the circuit layer L1, wherein the distance is, for example, the distance D between the chip 210 and the circuit layer L shown in FIG. 2. In one embodiment, the conductive layers 150a and 160a cover a side wall 142 of the electroless plating metal seed layer 140a, and contact the E-coat polymer layer 130a.

Referring to FIG. 2, in one embodiment, the interposer 100 may carry a chip 210 (e.g. a light emitting diode chip) electrically connected to the circuit layer L.

In view of the foregoing, since the insulating layer (the E-coat polymer layer) of the interposer is formed by electroplating in the present invention, the manufacturing cost may be lowered effectively. Furthermore, the surface property of the E-coat polymer layer of the present invention is suitable for the electroless plating process, and therefore the seed layer may be formed by the electroless plating process with lower manufacturing cost in the present invention, which may effectively lower the manufacturing cost of the interposer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of an interposer, comprising:
   providing a semiconductor substrate having a first surface, a second surface, and at least a through hole connecting the first surface to the second surface;
   forming an E-coat polymer layer on the first surface, the second surface, and an inner wall of the through hole; and
   forming a circuit layer on the E-coat polymer layer, wherein the circuit layer extends from the first surface to the second surface via the inner wall of the through hole, and wherein the E-coat polymer layer exposes a portion of the first surface, and the circuit layer exposes the portion of the first surface exposed by the E-coat polymer layer.

2. The manufacturing method of an interposer as claimed in claim 1, wherein the step of forming the circuit layer comprises:
   patterning the E-coat polymer layer, such that the E-coat polymer layer exposes a portion of the first surface and a portion of the second surface;
   performing an electroless plating process to form an electroless plating metal seed layer on the E-coat polymer layer; and
   electroplating at least a conductive layer on the electroless plating metal seed layer.

3. The manufacturing method of an interposer as claimed in claim 2, further comprising:
   after performing the electroless plating process and before electroplating the conductive layer, patterning the electroless plating metal seed layer, such that the electroless plating metal seed layer exposes a portion of the E-coat polymer layer.

4. The manufacturing method of an interposer as claimed in claim 2, wherein a material of the E-coat polymer layer is a photosensitive polymer material, and the method of patterning the E-coat polymer layer comprises exposure and development.

5. The manufacturing method of an interposer as claimed in claim 1, further comprising:
   before forming the circuit layer, performing a surface roughening treatment on the E-coat polymer layer.

6. The manufacturing method of an interposer as claimed in claim 1, further comprising:
   after forming the circuit layer, performing a dicing process to the semiconductor substrate.

7. The manufacturing method of an interposer as claimed in claim 1, wherein the step of providing the semiconductor substrate comprises:
   providing a base having an upper surface and a lower surface;
   forming at least a recess on the upper surface; and
   grinding the lower surface to remove a bottom of the recess so as to form a through hole.

8. An interposer, comprising:
   a semiconductor substrate having a first surface, a second surface, and at least a through hole connecting the first surface to the second surface;
   an E-coat polymer layer disposed on the first surface, the second surface, and an inner wall of the through hole; and
   a circuit layer disposed on the E-coat polymer layer, and extending from the first surface to the second surface via the inner wall of the through hole, wherein the E-coat polymer layer exposes a portion of the first surface, and the circuit layer exposes the portion of the first surface exposed by the E-coat polymer layer.

9. The interposer as claimed in claim 8, wherein the E-coat polymer layer exposes a portion of the second surface.

10. The interposer as claimed in claim 8, wherein the circuit layer comprises:
    an electroless plating metal seed layer disposed on the E-coat polymer layer; and
    at least a conductive layer disposed on the electroless plating metal seed layer.

11. The interposer as claimed in claim 10, wherein the electroless plating metal seed layer exposes a portion of the E-coat polymer layer.

12. The interposer as claimed in claim 10, wherein a material of the electroless plating metal seed layer is pure copper.

13. The interposer as claimed in claim 10, wherein the conductive layer covers a side wall of the electroless plating metal seed layer, and contacts the E-coat polymer layer.

14. The interposer as claimed in claim 8, wherein a material of the E-coat polymer layer is a photosensitive polymer material.

15. The interposer as claimed in claim 8, wherein the interposer carries a chip electrically connecting to the circuit layer.

16. The interposer as claimed in claim 15, wherein the chip is a light emitting diode chip.

17. The manufacturing method of an interposer as claimed in claim 2, wherein a material of the electroless plating metal seed layer is pure copper.

18. A manufacturing method of an interposer, comprising:
    providing a semiconductor substrate having a first surface, a second surface, and at least a through hole connecting the first surface to the second surface;
    forming an E-coat polymer layer on the first surface, the second surface, and an inner wall of the through hole; and
    forming a circuit layer on the E-coat polymer layer, wherein the circuit layer extends from the first surface to the second surface via the inner wall of the through hole, and wherein the E-coat polymer layer exposes a portion of the first surface, and the circuit layer exposes the portion of the first surface exposed by the E-coat polymer layer.

19. The manufacturing method of an interposer as claimed in claim 18, wherein a material of the electroless plating metal seed layer is pure copper.

* * * * *